(12) United States Patent
Saruhan-Brings et al.

(10) Patent No.: US 7,048,836 B2
(45) Date of Patent: May 23, 2006

(54) THERMAL-INSULATING MATERIAL HAVING AN ESSENTIALLY MAGNETOPLUMBITIC CRYSTAL STRUCTURE

(75) Inventors: Bilge Saruhan-Brings, Troisdorf (DE); Uwe Schulz, Neunkirchen-Seelscheid (DE); Claus Jürgen Kroder, St. Augustin (DE)

(73) Assignee: Deutsches Zentrum fur Luft-und Raumfahrt e.V., Bonn (DE)

( * ) Notice: Subject to any disclaimer, the term of this patent is extended or adjusted under 35 U.S.C. 154(b) by 0 days.

(21) Appl. No.: 10/141,341

(22) Filed: May 9, 2002

(65) Prior Publication Data

US 2002/0197503 A1     Dec. 26, 2002

(30) Foreign Application Priority Data

May 9, 2001  (DE) ................................ 101 22 545

(51) Int. Cl.
*C23C 14/46* (2006.01)
*C23C 14/30* (2006.01)

(52) U.S. Cl. ............... 204/192.11; 427/596; 427/255.32

(58) Field of Classification Search ........... 204/192.11; 427/596, 255.19, 255.32; 428/469, 699, 428/701, 702, 697, 700, 472, 472.2; 416/241 R, 416/241 B; 501/126, 127, 128, 133, 134, 501/152, 153, 154

See application file for complete search history.

(56) References Cited

FOREIGN PATENT DOCUMENTS

| DE | 198 07 163 C1 | | 10/1999 |
|---|---|---|---|
| EP | 0 812 930 A1 | | 12/1997 |
| EP | 0 890 559 A1 | | 1/1999 |
| WO | 99/42630 | * | 2/1999 |

OTHER PUBLICATIONS

Cinibluk, M.K.,—"Effect of Divalent Cations of the Systhesis of Citrate-Gel-Derived Lanthanum Hexaluminate Powders and Films", J. Mater. Res., vol. 14, Chapter 9, pp. 3581-3593 (1999).

* cited by examiner

*Primary Examiner*—Jennifer McNeil
(74) *Attorney, Agent, or Firm*—Venable LLP; Thomas G. Wiseman

(57) ABSTRACT

Thermal-insulating material provided on a metal substrate by means of an EB-PVD process includes a metal having a substantially magnetoplumbitic crystal structure and having a chemical composition according to general formula: $Ln^{3+}M^{2+}_{1+x}Q^{4+}_{4}Al_{11-2x}O_{19}$. The thermally-insulated metal substrate may advantageously include an adhesive layer provided between the surface of the metal substrate and the thermal-insulating layer. The process for producing the thermal-insulated metal substrate includes applying the thermal-insulating material onto a surface of the metal substrate employing an EB-PVD process.

2 Claims, No Drawings

THERMAL-INSULATING MATERIAL HAVING AN ESSENTIALLY MAGNETOPLUMBITIC CRYSTAL STRUCTURE

BACKGROUND OF THE INVENTION

1. Field of the Invention

The invention relates to a thermal-insulating material having an essentially magnetoplumbitic crystal structure, a metal substrate having an adhesive layer and a thermal-insulating layer—made of the thermal-insulating material—on its surface, as well as a process for coating of metal substrates with the thermal-insulating material.

2. Description of the Related Art

Thermal-insulating layers are primarily used in stationary gas turbines for energy production and in flight gas turbines. These applications pose more and more increasing demands on the mechanical and thermal properties of the materials to be used. The primary goal of this development is the rise of the temperature of the hot gas, in order to increase the efficacy and the power, when concurrently reducing the fuel consumption. Additionally, it should be achieved, that by a complete combustion of the fuel at high temperatures a lower environmental impact caused by pollutants is allowed.

In order to meet the requests for higher degrees of effectiveness and thus for lower energy consumption, the inlet temperatures of the turbine gas have to be increased to 1500° C. in the future. In this case, the extremely stressed constructional units are the rotating turbine buckets which generally are made of superalloys of nickel and cobalt. Since these alloys have a melting point $T_s$ between 1250° C. and 1320° C. and the surface temperature is ca. 1000° C. to 1200° C. during application, these materials are already used up to 0.9 $T_s$. The lifetime of these materials was increased by introducing the directionally solidified and monocrystal-line turbine buckets and the development of the increasingly expensive film cooling and internal cooling of the turbine elements. However, this causes power losses by the uneconomical increase of the amount of cooling air. Therewith, the limits of the material stress are reached which do not allow a further increase of the gas temperature with usual basis materials.

Another possibility to increase the temperature of the hot gas is the coating of thermally stressed turbine elements with a thermally insulating, ceramic layer of a thermal-insulating material. By application of a ceramic cover layer, the difference between the gas temperature and the temperature of the turbine material can be further increased when using an unchanging amount of cooling air. In order to realize the operation under higher gas temperatures, the basic demands, as a high melting point, a low vapor pressure, a high phase stability, a low thermal conductivity, a possibly high coefficient of thermal expansion, a possibly low density, an adapted emissivity for infrared radiation as well as a high resistance to thermal shock, oxidation and corrosion, must be posed on the material thereby used. All these demands taken together are not met at present by any ceramic material. The partly stabilized zirconium oxide turned out to be the most promising material. The attractiveness of zirconium oxide as a thermal-insulating layer is based upon its coefficient of thermal expansion (11 to 13×$10^{-6}$ $K^{-1}$) which is relatively high for ceramic materials, the good thermal shock resistance and the very low thermal conductivity 2 to 3 W/mk).

The present state of the art for producing ceramic thermal-insulating layers are the so called Duplex Systems which consist in general of two different layers. To the layer system are belonging a ceramic cover layer on the surface and a metallic adhesive layer (a so called Bond-Coat—BC) to improve the adhesion of the applied ceramic layer und to further protect the basis alloy from oxidation and hot gas corrosion. Layers of adhesive agents are made of an alloy of M-CrAlY and/or of aluminide. During use and already during the preparation of the layers a thin continuous layer of aluminum oxide is formed on the surface of the bond-coats, which—due to the low oxygen diffusion—represents an effective protection against oxidation for the metallic substrate, and which imparts a good adhesion to the following ceramic layer. Therefore, a complex profile of constraints is posed on the adhesive layer. The adhesive layer has to diminish the internal stresses occurred due to the different thermal expansion coefficients, it has to reduce stress peaks by ductile material behavior and it has to form a dense oxide layer, whereby the growing oxide has to be thermomechanically compatible with the underlying thermal-insulating material.

The preparation of such Duplex Systems has been allowed by virtue of different processes, principally by plasma spraying (PS), the CVD-process and the electron beam evaporation ((Electron Beam Physical Vapor Deposition(EB-PVD)). With PS-processes a lamellar, plate-like microstructure having a high porosity and microcracks is obtained. This morphology is formed by the deformation and the rapid solidification of molten particles on the comparatively cold substrate. Accordingly, the surface of the PS-ceramic layer is rough, and an aftertreatment is necessary, to avoid velocity losses. A further disadvantage of the process is the plugging of boreholes for cooling air during coating, which require another aftertreatment. The advantages of the process are the cost saving and the high degree of automatization.

Less cost saving processes are available in form of high vacuum evaporation techniques which result in qualitatively better layers. The thermal-insulating layers made by EB-PVD possess a columnar microstructure having a high porosity, too. Due to a better expansion tolerance of this columnar morphology, the EB-PVD layers have a longer lifetime, because this morphology effects an extraordinary adaptability of the layer to the mechanical deformation and the thermal expansion of the metallic substrate.

In the EB-PVD process, a finely focused electron beam having programmable pattern is passed in a vacuum chamber over the ceramic to be evaporated which is continuously recharged from below. Depending on the ceramic, a melt having a depth of 1 to 30 mm is obtained which is overheated for a more effective evaporation. The preheated elements or specimens, for instance, turbine elements, are positioned and/or moved in a suitable manner in the vapor cloud, such that by deposition of vapor particles on the surfaces a continuous growing of the layer takes place. Evaporation coating rates of 10–20 μm per minute can be achieved with $ZrO_2$ partly stabilized by $Y_2O_3$ (PYSZ) without rotating the sample. In order to achieve stoichiometry with oxide ceramics, the introduction of oxygen is essential in most cases (reactive evaporation coating), for which reason the coating of ceramics is done in a pressure range of between $10^{-2}$ and $10^{-4}$ mbar.

DE 198 07 163 C1 relates to a thermal-insulating material and processes for the production of the same. A thermochemically stable and phase-stable oxidic thermal-insulating material is mentioned which advantageously can be used in the form of a thermal-insulating layer on thermally highly stressed parts, as for instance, turbine buckets etc. The thermal-insulating material can be processed by plasma spraying, and preferably it consists of a magnetoplumbitic phase in the preferred composition range of $MMeAl_{11}O_{19}$, whereby M means La or Nd, and Me is chosen from the alkaline earth metals, transition metals and the rare alkaline earth metals, preferably from magnesium, zinc, cobalt, manganese, iron, nickel and chromium.

Magnesium oxide-doped magnetoplumbitic coatings are not suitable for EB-PVD processes. Due to the extreme high vapour pressure of MgO, said oxide precipitates too early from the system and prevents a stoichiometric precipitation. A crystalline precipitation of said phase requires an additional heating, in order to heat die substrate to a temperature above the crystallization temperature (for example >1000° C.).

EP 0 812 930 A1 describes thermal evaporating materials (ingots) for coating articles by physical deposition from the gas phase. In addition to the preparation and use of the same, ceramic evaporating materials are described which comprise a non-sintered mixture of at least two powder fractions of a coarse-grained powder and a fine-grained powder.

EP 0 890 559 A1 describes a process for coating oxidic fibre materials with metal aluminates for the production of failure-resistant, high-temperature stable, oxidatively stable composite materials.

M. K. Cinibulk, J. M. Res., vol. 14, tome 9, pages 3581–3593 (1999), describes the effect of divalent cations in the production of lanthanumhexaaluminate powders and films derived from Citragel. Among other things, magnetoplumbitic materials having the general formula $Ln^{3+}M^{2+}_{1+x}Q_x^{4+}Al_{11-2x}O_{19}$ are examined. It has been suggested, to perform fibre coatings with this material.

In spite of the previous success with layers of zirconium oxide, the high-temperature stability remains only partly fulfilled. Thermal stability, i.e. no phase transfer, no change of the Young modulus and the microstructure during application are primary conditions. Furthermore, the weight is contemplated as a critical factor in the design of rotating gas turbines components. Ceramic thermal-insulating layers are not load-bearing materials and add to the weight without increasing the strength. Therefore, such materials which have little weight but which contribute more to the thermal protection, are especially desired.

Essentially, the problem of the invention is based on the preparation of a more stable thermal-insulating material—especially by EB-PVD processes—which has better high-temperatures properties and which is especially suitable for coating of rotating and non-rotating high-temperature stressed elements.

SUMMARY OF THE INVENTION

A first aspect of the invention is a high-temperature stable thermal-insulating layer on a metal substrate, which has a chemical composition according to $Ln^{3+}M^{2+}_{1+x}Q_x^{4+}Al_{11-2x}O_{19}$ ($0 \leq x \leq 1$) and which consists essentially of a magnetoplumbitic crystal structure.

In a preferred embodiment of the present invention, the thermal-insulating material is characterized in that the lanthanoide is selected from La, Ce, Pr, Nd, Pm, Sm, Eu and/or Gd.

Analogous therewith, the divalent metal element is preferably chosen from Mn, Fe, Co, Ni, Cu, Zn and/or Sr.

In the sense of the present invention, the tetravalent metal element, chosen from Ti and/or Si, is especially preferred.

A thermal-insulating material prepared by EB-PVD, which is made of manganese and titanium containing Lanthanumhexaaluminate, wherein Al was partly substituted by Mn or Co and Mn plus Ti, is a preferred material, and it has a potential to increase the compression resistance. The magnetoplumbitic structure of this material allows the formation of cleavable and stemlike grains within the layer columns, by which the high-temperature stability of the thermal-insulating layers is increased during use.

DETAILED DESCRIPTION OF THE INVENTION

The magnetoplumbitic structure is hexagonal and consists of spinel-like blocks as well as mirror planes which are separating these spinel-like blocks. Spinel-like blocks involve cations of $Al^{3+}$ and $M^{2+}$ and $Q^{4+}$. However, $La^{3+}$ is located in the mirror plane together with the residual $Al^{3+}$-ions. The building-in of divalent and tetravalent cations compresses the spinel-like block, and, thereby, the crystallization behavior and the area of homogeneity of the magnetoplumbitic La-hexaaluminates are improved. The low thermal conductivity, the relatively low Young module and the compression resistant crystal structure of this material are the most attractive reasons why $LaMnAl_{11}O_{19}$ can be used as a thermal-insulating layer in the best possible manner.

Thermal-insulating layers are subject to a very complex profile of constraint during use, and therefore, they are subject to a variety of different mechanisms of damaging. This induces the efficiency and the lifetime of the thermal-insulating layer, and it is manifested by a change of the morphology, and, therefore, also by a change of the properties of the material at higher temperatures and during longer periods. The mechanisms of damaging lead to an ageing and to a failure of the thermal-insulating layers in the form of mechanical, thermomechanical or thermochemical processes, for instance, fatigue, oxidation, crack-forming, creeping and sintering. The microstructural change of the thermal-insulating layer due to compression or sintering results in a reduction of the intercolumnary and intracolumnary porosity and in a coarsening of the microstructure in the columns. Thereby, the elastic modulus, the thermal conductivity and internal stresses are increased.

It was found that with the EB-PVD layers according to the invention these properties are increased in a lesser degree as compared to the PS layers, by the compression of the columnar structure, however, the strain allowance will be reduced.

According to the invention, the thermal-insulating material contains in a particularly preferred embodiment a mole fraction of Ln in relation to the charged $Ln_2O_3$ of 1 to 10 mole %.

Similarly, thermal-insulating materials according to the invention are particularly preferred when the mole fraction of the divalent metal element is from 0 to 25 mole-%, particularly from 0.1 to 25 mole-%, particularly preferred from 1 to 15 mole-%.

Similarly, thermal-insulating materials according to the invention are especially preferred in the meaning of the present invention when the mole fraction of the tetravalent metal element is from 0 to 5 mole-%, particularly from 0.1 to 5 mole-%. In this meaning it is important that the mole fraction of the divalent metal element and of the tetravalent metal element can not be 0 simultaneously, since in this case a Lanthanumhexaaluminate would be described.

When, in the sense of the present invention, it is mentioned that the crystal structure has to be of an essentially magnetoplumbitic nature, a crystal structure comprising at least 80 percent by weight, particularly 90 percent by weight of the thermal-insulating material, is understood by this.

In a particularly preferred manner according to the present invention, the thermal-insulating material is applied onto a metal substrate, which is coated with an adhesive layer, by the EB-PVD-process.

Accordingly, another aspect of the present invention is a metal substrate having a thermal-insulating layer—which is made of a thermal insulating material—on its surface, as defined previously. The metal substrates according to the invention consist preferably of nickel or cobalt alloys. These can, for instance, be used for the production of gas turbine elements arranged on the hot gas side, particularly of turbine buckets.

As usual in the state of the art, an adhesive layer according to the invention, particularly made of an M-CrAlY alloy and/or of an aluminide, may also be provided between the surface of the metal substrate and the thermal-insulating material.

A further aspect of the present invention is a process for the coating of metal substrates having a thermal-insulating layer on the surface of the metal substrate which is coated with an adhesive layer, wherein the metal substrate has a special morphology and structural constitution. On the one hand this comprises the production of the ingot, for instance, according to EP 0 812 930 A1 by a chemical process, and on the other hand this comprises the preparation of the thermal-insulating layer by the EB-PVD-process.

Due to the more favorable properties—which are stated in the table specified below—, particularly Mn and Mn+Ti substituted magnetoplumbitic Ln-hexaaluminate is a very suitable material for thermal-insulating applications, and it offers a better alternative to conventional PYSZ-layers.

| Material | Thermal conductivity (W/mk) | Coefficient of expansion ($\times 10^{-6}$ K$^{-1}$) | Young modulus | Density (g/cm$^3$) | Melting point (° C.) |
|---|---|---|---|---|---|
| La-MnMP* | $\lambda_{RT} = 0.8$–2.2<br>$\lambda_{1200} = 1.2$–2.6 | 9.5–10.7 | 127 | 3.9–4.2 | 1930 |
| YSPZ** | $\lambda_{RT} = 0.6$–1.8<br>$\lambda_{1200} = 2.2$–2.4 | 10.8–11.6 | 242 | 5.95 | 2710 |

*according to the invention
**comparison

With the aid of the thermal-insulating layers according to the invention the following can be provided:
a higher thermal insulation caused by the material properties of the multicomponent magnetoplumbitic LnM$_{1+x}$Q$_x^{4+}$Al$_{11-2x}$O$_{19}$-layers and by their brown color,
the EB-PVD-preparation of a thermal-insulating layer from a material system consisting of 3 or 4 oxides by the one-crucible-process, and
the attainment of a higher homogeneity in the vapor bath, but also in the high-temperature stable EB-PVD layers by ingots prepared in a chemical way.

WORKING EXAMPLES

Example 1

Reference Example

Production of LaMnAl$_{11}$O$_{19}$-EB-PVD-Coatings which are Prepared from γ-Al$_2$O$_3$ Powder and from an Organic/Inorganic Based Solution:

The following preparation steps were performed in order to get 795 g of LaMnAl$_{11}$O$_{19}$ powder. 2000 ml of a 0.62 molar solution of lanthanum acetate in absolute ethanol were peptized with ca. 100 ml of concentrated HNO$_3$. 2000 ml of ethanol and an 1 M aqueous solution of Mn(NO$_3$)$_2$ were added to the mixture. 705 g of fine γ-Al$_2$O$_3$ powder were added to this clear sol with continuous stirring. The pH of the mixture was 6. The gelation process (solidification process) was performed with continuous stirring and addition of ca. 1000 ml of a mixture (pH=12) of H$_2$O/NH$_3$. A reaction time of ca. 10 hours was provided for the gelation process. The alcohol of the powdered mixture was evaporated on the rotary evaporator, and in such a way the LaMnAl$_{11}$O$_{19}$-precursor powder was collected. ⅓ of the powder was calcined at 1500° C., ⅔ of the same was calcined at 1200° C.

Example 2

Reference Example

Production of LaMn$_{0.5}$Ti$_{0.3}$Al$_{10.2}$O$_{19}$-EB-PVD-Coatings which are Prepared from Organic/Inorganic Based Solution Mixtures:

1000 ml of a 0.32 molar solution of lanthanum acetate (La(OOCCH$_3$)$_3$) in absolute ethanol were peptized with ca. 30 ml of concentrated HNO$_3$ to get 500 g of LaMn$_{0.5}$Ti$_{0.3}$Al$_{10.2}$O$_{19}$. 110 g of an aqueous solution of 50% of Mn(NO$_3$)$_2$ were added to this solution. 54 g of Ti-isopropoxide were mixed with 100 ml of ethanol and added to this solution. A clear sol was obtained, to which 890 g of Al-sec-butoxide ((Al(OC$_4$H$_9$)$_3$) is added under continuous stirring. Thereby, a slightly exothermic reaction was observed. The mixture was hydrolyzed with distilled water under strong stirring.

The alcohol of the powdered mixture was evaporated on the rotary evaporator, and in such a way the LaMn$_{0.5}$Ti$_{0.3}$Al$_{10.2}$O$_{19}$-precursor powder was collected. The quasi-dried precursor powder was further pyrolyzed in a drying cabinet at 200° C. ⅓ of the powder was calcined at 1500° C., ⅔ of the same was calcined at 1200° C.

Example 3

Reference Example

Preparation of the Ingot

Conventional waxes (binder) (SS 1%, ST 1%, PEG 600 2%, EP 2%) were dissolved in preheated ethanol, and for that purpose, the powder mixture was given to a driven Ultraturrax.

The mixture of powder and binder was dried on a rotary evaporator at 80° C., then it was sieved to 500 μm and finally granulated.

The ingot having a diameter of 63 mm and a height of approximately 80 mm was pressed in a steel matrix. Subsequently, the ingot was further compressed in a cold isostatic press. The ingot was turned to size according to dimensions of the ingot holder of the EB-PVD plant, and it was annealed in order to eliminate the binder.

Example 4

According to the Invention

Thermal-Insulating Layer Coating

The pressed and outgassed ingot according to example 3 was introduced into a EB-PVD plant. In the EB-PVD process, a finely focused electron beam having defined pattern is passed in a vacuum chamber over the ceramic-ingot to be evaporated, which is continuously recharged from below. The power—necessary for the evaporation—having a value of 30 to 60 kW was comparable to the usual values of P-YSZ. A layer thickness of 1–10 μm per minute was attained. The coating process was successfully applied in a pressure range between $10^{-2}$ to $10^{-4}$ mbar on preheated (ca. 800–1000° C.) metallic and/or ceramic substrates. The obtained layers were brown, well adherent and had a crystalline structure.

What is claimed is:

1. A process for producing the thermal insulated metal substrate having:

a metal substrate;

a thermal-insulating layer which is provided by means of an EB-PVD process on a surface of the metal substrate and which is comprised of a thermal insulating material having a substantially magnetoplumbitic crystal structure and a chemical composition according to the general formula:

$$Ln^{3+}M^{2+}{}_1Al_{11}O_{19},$$

where Ln is a lanthanide, M is a divalent metal element selected from the group consisting of Mn, Fe, Co, Ni, Cu, Zn and Sr, comprising:

applying the thermal insulating material onto a preheated surface of the metal substrate employing an EB-PVD process.

2. The process according to claim 1, further comprising providing an adhesive layer on the surface of then metal substrate prior to applying the thermal insulating material thereon.

* * * * *